(12) United States Patent
Kawazu et al.

(10) Patent No.: US 9,170,492 B2
(45) Date of Patent: Oct. 27, 2015

(54) SILICON-CONTAINING FILM-FORMING COMPOSITION, SILICON-CONTAINING FILM, AND PATTERN FORMING METHOD

(75) Inventors: Tomoharu Kawazu, Tokyo (JP); Masato Tanaka, Tokyo (JP); Takashi Mori, Tokyo (JP); Kazunori Takanashi, Tokyo (JP); Kyoyu Yasuda, Tokyo (JP)

(73) Assignee: JSR CORPORATION, Tokyo (JP)

( * ) Notice: Subject to any disclaimer, the term of this patent is extended or adjusted under 35 U.S.C. 154(b) by 929 days.

(21) Appl. No.: 12/722,529

(22) Filed: Mar. 12, 2010

(65) Prior Publication Data

US 2010/0233632 A1 Sep. 16, 2010

(30) Foreign Application Priority Data

Mar. 13, 2009 (JP) .................................. 2009-061907

(51) Int. Cl.
| | | |
|---|---|---|
| G03F 7/075 | (2006.01) | |
| G03F 7/09 | (2006.01) | |
| G03F 7/30 | (2006.01) | |
| G03F 7/36 | (2006.01) | |
| C08G 77/04 | (2006.01) | |
| C08G 77/00 | (2006.01) | |

(52) U.S. Cl.
CPC .............. *G03F 7/0752* (2013.01); *C08G 77/04* (2013.01); *G03F 7/0757* (2013.01); *G03F 7/091* (2013.01); *G03F 7/094* (2013.01); *G03F 7/30* (2013.01); *G03F 7/36* (2013.01); *C08G 77/80* (2013.01)

(58) Field of Classification Search
USPC ........................................ 430/270.1; 525/474
See application file for complete search history.

(56) References Cited

U.S. PATENT DOCUMENTS

| 6,576,393 | B1 | 6/2003 | Sugita et al. | |
|---|---|---|---|---|
| 2009/0148789 | A1* | 6/2009 | Amara et al. | ............. 430/270.1 |
| 2010/0330505 | A1 | 12/2010 | Nakajima et al. | |

FOREIGN PATENT DOCUMENTS

| EP | 2011829 | | 1/2009 |
|---|---|---|---|
| EP | 2011829 A1 | * | 1/2009 |
| JP | 2000-292931 A | | 10/2000 |
| JP | 2000-356854 | | 12/2000 |
| JP | 2002-40668 | | 2/2002 |
| JP | 2002-060690 | | 2/2002 |
| JP | 2008-83668 | * | 4/2008 |
| JP | 4946787 B2 | | 5/2009 |
| JP | 2009-237363 | * | 10/2009 |
| WO | WO 2009/104552 | | 8/2009 |

OTHER PUBLICATIONS

Derwent English abstract for JP2002-60690 (2002).*
Derwent English abstract for JP2008-83668 (2008).*
Machine-assisted English translation of JP2008-83668, as provided by JPO (2008).*
Derwent English abstract for JP2009-237363 (2009).*
Machine-assisted English translation for JP 2009-237363, provided by JPO (2009).*
Taiwanese Office Action for corresponding TW Application No. 099106772, Dec. 18, 2012.
Japanese Office Action for corresponding JP Application No. 2010-053791, Dec. 3, 2013.
Office Action issued Sep. 15, 2015, in Japanese Patent Application No. 2010-53791 (w/ English translation).

* cited by examiner

*Primary Examiner* — Sin Lee
(74) *Attorney, Agent, or Firm* — Oblon, McClelland, Maier & Neustadt, L.L.P.

(57) ABSTRACT

A silicon-containing film-forming composition includes a polysiloxane and organic solvent. The polysiloxane includes a first structural unit, a second structural unit, and a third structural unit. The first structural unit is derived from a tetraalkoxysilane. The second structural unit is derived from a compound shown by a formula (1), wherein $R^1$ represents a hydrogen atom or an electron-donating group, at least one $R^1$ is an electron-donating group, $R^2$ represents a monovalent organic group, and n represents 0 or 1. The third structural unit is derived from a compound shown by a formula (2), wherein $R^3$ represents an alkyl group having 1 to 8 carbon atoms, and $R^4$ represents a monovalent organic group.

15 Claims, No Drawings

SILICON-CONTAINING FILM-FORMING COMPOSITION, SILICON-CONTAINING FILM, AND PATTERN FORMING METHOD

CROSS-REFERENCE TO RELATED APPLICATIONS

The present application claims priority under 35 U.S.C. §119 to Japanese Patent Application No. 2009-61907, filed Mar. 13, 2009. The contents of this application are incorporated herein by reference in their entirety.

BACKGROUND OF THE INVENTION

1. Field of the Invention

The present invention relates to a silicon-containing film-forming composition, a silicon-containing film, and a pattern forming method.

2. Discussion of the Background

When forming a pattern in the production of semiconductor devices or the like, microfabrication of an organic or inorganic substrate is performed using a pattern-transfer method which utilizes lithographic technology, a resist development process, and etching technology.

However, along with an increase in degree of integration of semiconductor devices provided on a circuit board, it has become difficult to accurately transfer an optical mask pattern to a resist film in an exposure step. For example, during a microfabrication process of a substrate, a dimensional error (deviation) of the resulting pattern may occur due to the effect of standing waves of light formed in the resist film. In order to reduce the effect of standing waves, an antireflection film is formed between the resist film and the surface of the substrate.

A resist pattern is also used as a mask when a substrate with a silicon oxide film, an inorganic interlayer dielectric, or the like formed thereon is processed. It is necessary to reduce the thickness of the resist film and the antireflection film along with the progress of miniaturization of patterns. Since slimming of a resist film lowers the mask performance of the resist film, there is a tendency that it is more difficult to provide a substrate with desired microfabrication without damaging it.

As a solution to this problem, a method of forming an underlayer processing film (silicon-containing film) on an oxide film or an interlayer dielectric of a substrate to be fabricated, transferring a resist pattern to the underlayer processing film, and dry-etching the oxide film or the interlayer dielectric using this underlayer processing film as a mask is used. Since the reflectance of such an underlayer processing film changes with the film thickness, it is necessary to adjust the composition and the like to minimize the reflectance according to the film thickness. Other requirements demanded of the underlayer processing film include capability of forming a rectangular resist pattern without a skirt-like foot and the like, excellent adhesion to the resist, a sufficient masking property when processing an oxide film and an interlayer dielectric, producing a minimal amount of development residue due to penetration of a resist material into the resist underlayer film, excellent resist film/resist underlayer film etching selectivity, and excellent storage stability as a solution, and the like.

In general, the resist film/resist underlayer film etching selectivity can be promoted by increasing the amount of Si atoms included in the silicon-containing film. A resin composition comprising polysiloxane using a tetraalkoxysilane has been proposed as a composition for obtaining a silicon-containing film with a large Si content (refer to Japanese Patent Application Publication (KOKAI) No. 2000-356854, Patent Application Publication No. 2002-40668, etc.).

SUMMARY OF THE INVENTION

According to one aspect of the present invention, a silicon-containing film-forming composition includes a polysiloxane and an organic solvent. The polysiloxane includes a first structural unit, a second structural unit, and a third structural unit. The first structural unit is derived from a tetraalkoxysilane. The second structural unit is derived from a compound shown by following formula (1). The third structural unit is derived from a compound shown by following formula (2).

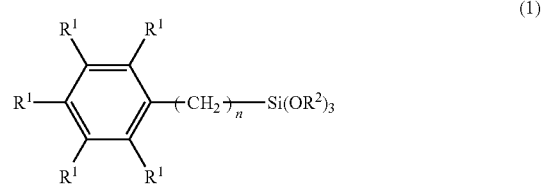

(1)

wherein $R^1$ represents a hydrogen atom or an electron-donating group, at least one $R^1$ is an electron-donating group, $R^2$ represents a monovalent organic group, and n represents 0 or 1.

$$R^3-Si(OR^4)_3 \qquad (2)$$

wherein $R^3$ represents an alkyl group having 1 to 8 carbon atoms, and $R^4$ represents a monovalent organic group.

According to another aspect of the present invention, a silicon-containing film is obtained using a composition. The composition includes a polysiloxane and an organic solvent. The polysiloxane includes a first structural unit, a second structural unit, and a third structural unit. The first structural unit is derived from a tetraalkoxysilane. The second structural unit is derived from a compound shown by following formula (1). The third structural unit is derived from a compound shown by following formula (2).

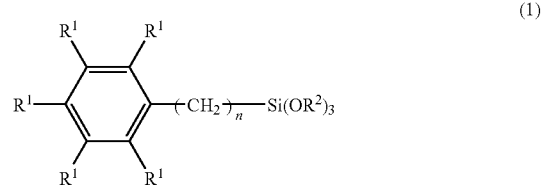

(1)

wherein $R^1$ represents a hydrogen atom or an electron-donating group, at least one $R^1$ is an electron-donating group, $R^2$ represents a monovalent organic group, and n represents 0 or 1.

$$R^3-Si(OR^4)_3 \qquad (2)$$

wherein $R^3$ represents an alkyl group having 1 to 8 carbon atoms, and $R^4$ represents a monovalent organic group.

According to still another aspect of the present invention, a pattern forming method includes applying a composition to a substrate to form a silicon-containing film. A resist composition is applied to the silicon-containing film to form a resist film. The resist film is exposed to radiation through a photomask. The exposed resist film is developed to form a resist pattern. The silicon-containing film and the substrate are dry-etched using the resist pattern as a mask to form a pattern.

DESCRIPTION OF THE EMBODIMENTS

The present invention will now be described in more detail by way of embodiments.

[1] Silicon-Containing Film-Forming Composition

The silicon-containing film-forming composition of the embodiment of the present invention includes (A) polysiloxane and (B) an organic solvent.

(1) Polysiloxane (A)

The polysiloxane (A) used in the silicon-containing film-forming composition of the embodiment of the present invention contains a structural unit (a1) derived from a tetraalkoxysilane.

The four alkoxy groups bonded to Si atoms in the tetraalkoxysilane for providing the structural unit (a1) may be the same or some alkoxy groups may be different from the others. The number of carbon atoms in the alkoxy group is preferably 1 to 8. These alkoxy groups are not necessarily linear, but may be branched or cyclic.

Specific examples of a tetraalkoxysilane include tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetrakis(2-ethylbutoxy)silane.

Among these, tetramethoxysilane, tetraethoxysilane, tetra-n-propoxysilane, tetra-iso-propoxysilane, tetra-n-butoxysilane, and tetra-sec-butoxysilane are preferable from the viewpoint of reactivity and ease of handling.

The polysiloxane (A) may contain only one type of structural unit (a1), or may contain two or more types of structural units (a1).

The polysiloxane (A) used in the embodiment of the present invention further contains a structural unit (a2) shown by the following formula (1),

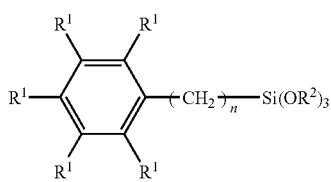

(1)

wherein $R^1$ represents a hydrogen atom or an electron-donating group, at least one $R^1$ is an electron-donating group, $R^2$ represents a monovalent organic group, and n represents 0 or 1.

The electron-donating group in $R^1$ of the above formula (1) has an effect of increasing the electron density of a specific site of a molecule.

As specific examples of the electron-donating group, an alkyl group having 1 to 4 carbon atoms, a hydroxyl group, a methoxy group, a phenoxy group, an amino group, a dimethylamino group, and an acetylamino group can be given.

Examples of the alkyl group having 1 to 4 carbon atoms include a methyl group, an ethyl group, an n-propyl group, an iso-propyl group, an n-butyl group, a 2-methylpropyl group, a 1-methylpropyl group, and a t-butyl group.

As examples of the monovalent organic group represented by $R^2$ in the formula (1), a methyl group, an ethyl group, a n-propyl group, an iso-propyl group, an n-butyl group, a sec-butyl group, a tert-butyl group, a γ-aminopropyl group, a γ-glycidoxypropyl group, and a γ-trifluoropropyl group can be given. Among these, a methyl group and an ethyl group are preferable.

$R^2$ may be either the same or different from each other.

Among the structural units (a2) derived from a compound shown by the above formula (1), those derived from a compound shown by the following formula (1-1) are preferable. When the polysiloxane (A) contains the structural unit (a2) derived from a compound shown by the following formula (1-1), the composition of the embodiment of the present invention can stably form a resist pattern with an excellent bottom shape without a skirt-like extension,

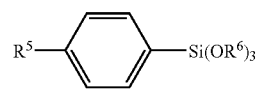

(1-1)

wherein $R^5$ represents an alkyl group having 1 to 4 carbon atoms and $R^6$ represents a monovalent organic group.

Examples of the alkyl group having 1 to 4 carbon atoms represented by $R^5$ in the formula (1-1) include a methyl group, an ethyl group, an n-propyl group, an iso-propyl group, an n-butyl group, a 2-methylpropyl group, a 1-methylpropyl group, and a t-butyl group.

The above explanation of the monovalent organic group represented by $R^2$ in the formula (1) applies as it is to the monovalent organic group represented by $R^6$.

Specific examples of the compound shown by the formula (1) include 4-methylphenyltrimethoxysilane, 4-methylphenyltriethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, and 4-acetylaminobenzyltrimethoxysilane.

Among these compounds, compounds shown by the above formula (1-1) such as 4-methylphenyltriethoxysilane, 4-methylphenyltrimethoxysilane, and 4-ethylphenyltrimethoxysilane, and 4-methoxyphenyltrimethoxysilane and 4-methylbenzyltrimethoxysilane, particularly 4-methylphenyltrimethoxysilane, 4-methylphenyltriethoxysilane, 4-methoxyphenyltrimethoxysilane, 4-methylbenzyltrimethoxysilane, and the like are preferable.

The polysiloxane (A) may contain only one type of structural unit (a2), or may contain two or more types of structural units (a2).

The polysiloxane (A) used in the embodiment of the present invention further contains a structural unit (a3) shown by the following formula (2).

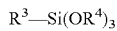 (2)

wherein $R^3$ represents an alkyl group having 1 to 8 carbon atoms, and $R^4$ represents a monovalent organic group.

Examples of the alkyl group having 1 to 8 carbon atoms represented by $R^3$ in the formula (2) include a methyl group, an ethyl group, an n-propyl group, an iso-propyl group, an n-butyl group, a 2-methylpropyl group, a 1-methylpropyl group, a t-butyl group, an n-pentyl group, n-hexyl group, an n-heptyl group, and an n-octyl group. Of these, alkyl groups having 1 to 4 carbon atoms are preferably used.

As examples of the monovalent organic group represented by $R^4$ in the formula (2), alkyl groups (either substituted or unsubstituted) such as a methyl group, an ethyl group, a n-propyl group, an iso-propyl group, an n-butyl group, a sec-butyl group, a tert-butyl group, a γ-aminopropyl group, a γ-glycidoxypropyl group, and a γ-trifluoropropyl group, substituted or unsubstituted alkenyl groups, phenyl groups, alkylcarbonyl groups, alkoxyalkyl groups, alkylsilyl groups [Si(R)$_3$— (R is a hydrogen atom or an alkyl group, provided at least one R is an alkyl group)], oxime groups, and the like can be given. Among these, a methyl group and an ethyl group are preferable.

$R^4$ may be either the same or different from each other.

As examples of the compound shown by the above formula (2), methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, methyltriacetoxysilane, methyltri-iso-propenoxysilane, methyltris(dimethylsiloxy)silane, methyltris(methoxyethoxy)silane, methyltris(methylethylketoxime)silane, methyltris(trimethylsiloxy)silane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, ethyltris(trimethylsiloxy)silane, ethyltriacetoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, n-propyltriacetoxysilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-sec-butoxysilane, iso-propyltri-tert-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, 2-methylpropyltrimethoxysilane, 2-methylpropyltriethoxysilane, 2-methylpropyltri-n-propoxysilane, 2-methylpropyltri-iso-propoxysilane, 2-methylpropyltri-n-butoxysilane, 2-methylpropyltri-sec-butoxysilane, 2-methylpropyl-tri-tert-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltri-iso-propoxysilane, 1-methylpropyltri-n-butoxysilane, 1-methylpropyltri-sec-butoxysilane, 1-methylpropyltri-tert-butoxysilane, 1-methylpropyltriphenoxysilane, tert-butyltrimethoxysilane, tert-butyltriethoxysilane, tert-butyltri-n-propoxysilane, tert-butyltri-iso-propoxysilane, tert-butyltri-n-butoxysilane, tert-butyltri-sec-butoxysilane, tert-butyltri-tert-butoxysilane, and tert-butyltriphenoxysilane can be given.

Among these, from the viewpoint of reactivity and ease of handling, methyltrimethoxysilane, methyltriethoxysilane, methyltri-n-propoxysilane, methyltri-iso-propoxysilane, methyltri-n-butoxysilane, methyltri-sec-butoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, and the like are preferable.

The polysiloxane (A) may contain only one type of structural unit (a3), or may contain two or more types of structural units (a3).

In addition to the above structural units (a1) to (a3), the polysiloxane (A) may contain a structural unit shown by the following formula (3) (hereinafter may be simply referred to as "structural unit (a4)").

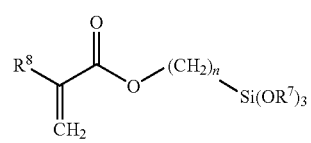

(3)

wherein $R^7$ represents a monovalent organic group, $R^8$ represents a linear or branched alkyl group having 1 to 4 carbon atoms, and n represents an integer of 1 to 4.

As examples of the monovalent organic group represented by $R^7$ in the formula (3), a methyl group, an ethyl group, a n-propyl group, an iso-propyl group, an n-butyl group, a sec-butyl group, a tert-butyl group, a γ-aminopropyl group, a γ-glycidoxypropyl group, and a γ-trifluoropropyl group can be given. Among these, a methyl group and an ethyl group are preferable.

$R^7$ may be either the same or different from each other.

Examples of the linear or branched alkyl group having 1 to 4 carbon atoms represented by $R^8$ in the formula (3) include a methyl group, an ethyl group, an n-propyl group, an iso-propyl group, an n-butyl group, a 2-methylpropyl group, a 1-methylpropyl group, and a t-butyl group.

In the formula (3) is an integer from 1 to 4, and preferably 1 to 3.

As examples of the compound shown by the above formula (3), 3-(trimethoxysilyl)propyl methacrylate, 3-(triethoxysilyl)propyl methacrylate, N-3-(methacryloxy-2-hydroxypropyl)-3-aminopropyltriethoxysilane, 2-(trimethoxysilyl)ethyl methacrylate, 2-(triethoxysilyl)ethyl methacrylate, trimethoxysilylmethyl methacrylate, methacryloxypropyltris(methoxyethoxy)silane, triethoxysilylmethyl methacrylate, 3-[tris(trimethylsiloxy)silyl]propyl methacrylate, 3-[tris(dimethylvinylsiloxy)]propyl methacrylate, 3-(trichlorosilyl)propyl methacrylate, 3-(trimethoxysilyl)propyl acrylate, and 3-(triethoxysilyl)propyl acrylate can be given.

Among these, 3-(trimethoxysilyl)propyl methacrylate, 3-(triethoxysilyl)propyl methacrylate, trimethoxysilylmethyl methacrylate, 2-(trimethoxysilyl)ethyl methacrylate, 2-(triethoxysilyl)ethyl methacrylate, and the like are preferable from the viewpoint of ease of synthesis of monomers.

The polysiloxane (A) may contain only one type of structural unit (a4), or may contain two or more types of structural units (a4).

In addition to the above other structural units (a4), the polysiloxane (A) used may contain still other structural units (a5).

As examples of the still other structural units (a5), those derived from compounds such as N-3-(triethoxysilyl)propylmethylsulfonamide, N-3-(triethoxysilyl)propylbenzylsulfonamide, N-3-(triethoxysilyl)propylbenzoylsulfonamide, N-3-(triethoxysilyl)propylvinylsulfonamide, N-3-(triethoxysilyl)propylcyanomethylsulfonamide, N-3-(triethoxysilyl)

propyl 3-mercaptopropyl-1-sulfonamide, N-3-(triethoxysilyl)propylbenzylsulfonamide, N-3-(triethoxysilyl)propyl-C-(2-cyanophenyl)methylsulfonamide, N-3-(triethoxysilyl)propyl-3,3-dimethylbutylsulfonamide, N-3-(triethoxysilyl)propyl-2-oxo-2-phenylethylsulfonamide, N-3-(triethoxysilyl)propyl-2-(2,5-dioxoimidazolin-4-yl)ethylsulfonamide, N-3-(triethoxysilyl)propyl-C-benzooxazole-2-yl-sulfonamide, N-3-(triethoxysilyl)propyl-C-benzooxazol-2-ylsulfonamide, N-2-(triethoxysilyl)ethylbenzylsulfonamide, N-2-(triethoxysilyl)ethylbenzoylsulfonamide, N-2-(triethoxysilyl)ethylmethylsulfonamide, N-2-(triethoxysilyl)ethyl ethylsulfonamide, N-2-(triethoxysilyl)ethyl-n-butylsulfonamide, N-2-(triethoxysilyl)ethyl-iso-butylsulfonamide, N-2-(triethoxysilyl)ethyloctylsulfonamide, N-2-(triethoxysilyl)ethylvinylsulfonamide, N-2-(triethoxysilyl)ethylallylsulfonamide, N-2-(triethoxysilyl)ethyl-2-phenylethylsulfonamide, N-2-(triethoxysilyl)ethyl-3-aminopropylsulfonamide, N-2-(triethoxysilyl)ethyl-2-cyanoethylsulfonamide, N-2-(triethoxysilyl)ethyl-3-nitrophenylsulfonamide, N-2-(triethoxysilyl)ethyl-4-nitrophenylsulfonamide, N-3-(trimethoxysilyl)propylbenzylsulfonamide, N-3-(trimethoxysilyl)propylbenzoylsulfonamide, N-3-(trimethoxysilyl)propylvinylsulfonamide, N-3-(trimethoxysilyl)propylcyanomethylsulfonamide, N-3-(trimethoxysilyl)propyl-3-mercaptopropyl-1-sulfonamide, N-3-(trimethoxysilyl)propylbenzylsulfonamide, N-3-(trimethoxysilyl)propyl-C-(2-cyanophenyl)methylsulfonamide, N-3-(trimethoxysilyl)propyl-3,3-dimethylbutylsulfonamide, N-3-(trimethoxysilyl)propyl-2-oxo-2-phenylethylsulfonamide, N-3-(trimethoxysilyl)propyl-2-(2,5-dioxoimidazolin-4-yl)ethylsulfonamide, N-3-(trimethoxysilyl)propyl-C-benzooxazole-2-yl-sulfonamide, N-3-(trimethoxysilyl)propyl-C-benzooxazol-2-ylsulfonamide, N-2-(trimethoxysilyl)ethylbenzylsulfonamide, N-2-(trimethoxysilyl)ethylbenzoylsulfonamide, N-2-(triethoxysilyl)ethylmethylsulfonamide, N-2-(trimethoxysilyl)ethyl ethylsulfonamide, N-2-(trimethoxysilyl)ethyl-n-butylsulfonamide, N-2-(trimethoxysilyl)ethyl-iso-butylsulfonamide, N-2-(trimethoxysilyl)ethyloctylsulfonamide, N-2-(trimethoxysilyl)ethylvinylsulfonamide, N-2-(trimethoxysilyl)ethylallylsulfonamide, N-2-(trimethoxysilyl)ethyl-2-phenylethylsulfonamide, N-2-(trimethoxysilyl)ethyl-3-aminopropylsulfonamide, N-2-(trimethoxysilyl)ethyl-2-cyanoethylsulfonamide, N-2-(trimethoxysilyl)ethyl-3-nitrophenylsulfonamide, N-2-(trimethoxysilyl)ethyl-4-nitrophenylsulfonamide, dimethyldimethoxysilane, diethyldimethoxysilane, dipropyldimethoxysilane, diphenyldimethoxysilane, methyl(3-acryloxypropyl)dimethoxysilane, di-tert-butyldichlorosilane, diethoxydivinylsilane, di(3-methacryloxypropyl)dimethoxysilane, dimethyldiethoxysilane, dimesityldimethoxysilane, dimesityldichlorosilane, di-iso-propyldimethoxysilane, di-iso-butyldimethoxysilane, dimethyldiacetoxysilane, diethyldiethoxysilane, dicyclopentyldimethoxysilane, di-n-butyldichlorosilane, di-tert-butyldichlorosilane, dicyclohexyldichlorosilane, acetoxypropyldichlorosilane, (3-acryloxypropyl)methyldichlorosilane, allyl hexyldichlorosilane, allylmethyldichlorosilane, allylphenyldimethoxysilane, aminopropylmethyldiethoxysilane, diphenyldiethoxysilane, diphenyldichlorosilane, dimethacryloxydimethoxysilane, tert-butylmethyldichlorosilane, tert-butylphenyldichlorosilane, 2-(carbomethoxy)ethylmethyldichlorosilane, 2-cyanoethylmethyldichlorosilane, 3-cyanopropylmethyldichlorosilane, 3-cyanopropylmethyldimethoxysilane, 3-cyanopropylphenyldichlorosilane, cyclohexylethyldimethoxysilane, cyclohexylmethyldimethoxysilane, cyclohexylmethyldichlorosilane, mercaptomethylethyldiethoxysilane, 3-mercaptopropylmethyldimethoxysilane, isobutylmethyldimethoxysilane, phenylmethyldichlorosilane, ethylmethyldichlorosilane, 3-methacryloxypropylmethyldiethoxysilane, p-tolylmethyldichlorosilane, phenethylmethyldichlorosilane, di(p-tolyl)dichlorosilane, di(3-glycidoxypropyl)dimethoxysilane, di(3-glycidoxypropyl)diethoxysilane, propyl(3-cyclohexenyl)dimethoxysilane, phenyltrimethoxysilane, phenyltriethoxysilane, and the like can be given.

The polysiloxane (A) may contain only one type of structural unit (a5), or may contain two or more types of structural units (a5).

In the polysiloxane (A), the content of the structural unit (a2) for 100 mol of the structural unit (a1) is preferably 1 to 20 mo, more preferably 2 to 18 mol, and particularly preferably 5 to 15 mo. When the content of the structural unit (a2) is 1 to 20 mol per 100 mol of the structural unit (a1), the reflection preventing effect at a wavelength of 193 nm is excellent.

If the content of the structural unit (a2) is less than 1 mol per 100 mol of the structural unit (a1), the shape of the resist pattern is poor and sufficient adhesion may not be obtained. If more than 20 mol, the anti-oxygen ashing properties may decrease.

The content of the structural unit (a3) for 100 mol of the structural unit (a1) is preferably 10 to 50 mol, more preferably 15 to 45 mol, and particularly preferably 20 to 40 mol. The content of the structural unit (a3) of 10 to 50 mol is preferable because of excellent resist pattern and sufficient adhesive properties.

If the content of the structural unit (a3) is less than 10 mol, it is difficult to control the polymerization reactivity and to control the molecular weight. If more than 50 mol, the anti-oxygen ashing property may decrease.

The content of the structural unit (a5) for 100 mol of the structural unit (a1) is preferably 1 to 30 mol, more preferably 1 to 20 mol, and still more preferably 2 to 15 mol. The content of the structural unit (a4) of 1 to 30 mol is preferable due to excellent resist pattern adhesion and anti-oxygen ashing properties.

The content of the structural unit (a5) for 100 mol of the structural unit (a1) is preferably 1 to 30 mol, more preferably 1 to 20 mol, and still more preferably 2 to 20 mol. When the content of the structural unit (a5) is 1 to 30 mol, coating properties and storage stability are excellent.

These contents of the structural units may be estimated from $^{29}$Si—NMR spectrum analysis result, for example.

The polystyrene-reduced weight average molecular weight (hereinafter referred to as "Mw") of the polysiloxane (A) determined by gel permeation column chromatography (GPC) is preferably about 500 to about 15,000, more preferably about 1000 to about 10,000, and still more preferably about 1500 to about 6000. When the Mw is about 500 to about 15,000, coating properties and storage stability are excellent.

There are no specific limitations to the method of producing the polysiloxane (A) of the embodiment of the present invention. The polysiloxane (A) can be obtained by hydrolysis condensation of compounds providing each structural unit as raw material monomers. Specifically, the polysiloxane (A) can be obtained by dissolving the starting raw materials in an organic solvent and adding water intermittently or continuously to the resulting solution to carry out the hydrolysis condensation reaction. In this instance, a catalyst may be previously dispersed in the organic solvent or may be dissolved or dispersed in water which is added later. The temperature of the hydrolysis-condensation reaction is usually 0 to 100° C.

In preparing the polysiloxane (A), it is possible (1) to hydrolyze and condense a mixture of the raw material compounds, or (2) to carry out the hydrolysis condensation reaction using either the hydrolyzate or condensate of each compound, or at least one of hydrolyzate and condensate of the selected compound.

Although not particularly limited, ion-exchange water is preferably used as water for the hydrolysis condensation reaction. The water is used in an amount of 0.25 to 3 mols, and preferably 0.3 to 2.5 mols per one mol of the alkoxyl groups in the compounds used as the raw material.

If the amount of water in this range is used, there will be no possibility of a decrease in uniformity of the formed coating and almost no possibility of a decrease in storage stability of the resulting composition.

The solvent used is not particularly limited. Examples of the solvent include methanol, ethanol, 1-propanol, 2-propanol, ethylene glycol, propylene glycol, glycerol, 1-butanol, 2-butanol, 2-methyl-1-propanol, 2-methyl-2-propanol, 1,4-butanediol, 1-pentanol, 1-methyl-1-butanol, 2-methyl-1-butanol, 3-methyl-1-butanol, cyclopentanol, 1-hexanol, 4-methyl-2-pentanol, cyclohexanol, 1-heptanol, cycloheptanol, 1-octanol, n-nonyl alcohol, n-decyl alcohol, diethylene glycol, dipropylene glycol, triethylene glycol, tripropylene glycol, diethylene glycol monomethyl ether, diethylene glycol monobutyl ether, triethylene glycol monomethyl ether, triethylene glycol monobutyl ether, diethylene-glycol mono-iso-butyl ether, diethylene glycol monohexyl ether, diethyleneglycol mono-2-ethylhexyl ethanol, diethylene glycol monobenzyl ether, propylene glycol monomethyl ether, propylene glycol monoethyl ether, propylene glycol monopropyl ether, dipropylene glycol monomethyl ether, dipropylene glycol monopropyl ether, dipropylene glycol monobutyl ether, tripropylene glycol monomethyl ether, 4-methoxy 1-butanol, 2-methoxyethanol, 2-isopropoxy ethanol, 2-butoxy ethanol, 2-isobutoxy ethanol, 2-hexyloxy ethanol, 2-(2-ethyl)hexyloxy ethanol, 2-allyloxy ethanol, 2-phenoxy ethanol, 2-benzyloxy ethanol, 1-butoxy-2-propanol, and 1-phenoxy-2-propanol.

As examples of the catalyst, a metal chelate compound, an organic acid, an inorganic acid, an organic base, and an inorganic base can be given.

Specific examples of the metal chelate compound include titanium chelate compounds such as triethoxy.mono(acetylacetonate)titanium, tri-n-propoxy.mono(acetylacetonate)titanium, tri-iso-propoxy.mono(acetylacetonate)titanium, tri-n-butoxy.mono(acetylacetonate)titanium, tri-sec-butoxy.mono(acetylacetonate)titanium, tri-t-butoxy.mono(acetylacetonate)titanium, diethoxy.bis(acetylacetonate)titanium, di-n-propoxy.bis(acetylacetonate)titanium, di-iso-propoxy.bis(acetylacetonate)titanium, di-n-butoxy.bis(acetylacetonate)titanium, di-sec-butoxy.bis(acetylacetonate)titanium, di-t-butoxy.bis(acetylacetonate)titanium, monoethoxy.tris(acetylacetonate)titanium, mono-n-propoxy.tris(acetylacetonate)titanium, mono-iso-propoxy.tris(acetylacetonate)titanium, mono-n-butoxy.tris(acetylacetonate)titanium, mono-sec-butoxy.tris(acetylacetonate)titanium, mono-tert-butoxy.tris(acetylacetonate)titanium, tetrakis(acetylacetonate)titanium, triethoxy.mono(ethylacetoacetato)titanium, tri-n-propoxy.mono(ethylacetoacetato)titanium, tri-iso-propoxy.mono(ethylacetoacetato)titanium, tri-n-butoxy.mono(ethylacetoacetato)titanium, tri-sec-butoxy.mono(ethylacetoacetato)titanium, tri-tert-butoxy.mono(ethylacetoacetato)titanium, diethoxy.bis(ethylacetoacetato)titanium, di-n-propoxy.bis(ethylacetoacetato)titanium, di-iso-propoxy.bis(ethylacetoacetato)titanium, di-n-butoxy.bis(ethylacetoacetato)titanium, di-sec-butoxy.bis(ethylacetoacetato)titanium, di-tert-butoxy.bis(ethylacetoacetato)titanium, monoethoxy.tris(ethylacetoacetato)titanium, mono-n-propoxy.tris(ethylacetoacetato)titanium, mono-iso-propoxy.tris(ethylacetoacetato)titanium, mono-n-butoxy.tris(ethylacetoacetato)titanium, mono-sec-butoxy.tris(ethylacetoacetato)titanium, mono-tert-butoxy.tris(ethylacetoacetato)titanium, tetrakis(ethylacetoacetato)titanium, mono(acetylacetonate)tris(ethylacetoacetato)titanium, bis(acetylacetonate)bis(ethylacetoacetato)titanium, and tris(acetylacetonate)mono(ethylacetoacetato)titanium; zirconium chelate compounds such as triethoxy.mono(acetylacetonate)zirconium, tri-n-propoxy.mono(acetylacetonate)zirconium, tri-iso-propoxy.mono(acetylacetonate)zirconium, tri-n-butoxy.mono(acetylacetonate)zirconium, tri-sec-butoxy.mono(acetylacetonate)zirconium, tri-tert-butoxy.mono(acetylacetonate) zirconium, diethoxy.bis(acetylacetonate)zirconium, di-n-propoxy.bis(acetylacetonate)zirconium, di-iso-propoxy.bis(acetylacetonate)zirconium, di-n-butoxy.bis(acetylacetonate)zirconium, di-sec-butoxy.bis(acetylacetonate)zirconium, di-tert-butoxy.bis(acetylacetonate)zirconium, mono-ethoxy.tris(acetylacetonate)zirconium, mono-n-propoxy.tris(acetylacetonate)zirconium, mono-iso-propoxy.tris(acetylacetonate)zirconium, mono-n-butoxy.tris(acetylacetonate)zirconium, mono-sec-butoxy.tris(acetylacetonate)zirconium, mono-tert-butoxy.tris(acetylacetonate)zirconium, tetrakis(acetylacetonate)zirconium, triethoxy.mono(ethylacetoacetato)zirconium, tri-n-propoxy.mono(ethylacetoacetato)zirconium, tri-iso-propoxy.mono(ethylacetoacetato)zirconium, tri-n-butoxy.mono(ethylacetoacetato)zirconium, tri-sec-butoxy.mono-(ethylacetoacetato)zirconium, tri-tert-butoxy.mono(ethylacetoacetato)zirconium, diethoxy.bis(ethylacetoacetato)zirconium, di-n-propoxy.bis(ethylacetoacetato)zirconium, di-iso-propoxy.bis(ethylacetoacetato)zirconium, di-n-butoxy.bis(ethylacetoacetato)zirconium, di-sec-butoxy.bis(ethylacetoacetato)zirconium, di-tert-butoxy.bis(ethylacetoacetato)zirconium, monoethoxy.tris(ethylacetoacetato)zirconium, mono-n-propoxy.tris(ethylacetoacetato)zirconium, mono-iso-propoxy.tris(ethylacetoacetato)zirconium, mono-n-butoxy.tris(ethylacetoacetato)zirconium, mono-sec-butoxy.tris(ethylacetoacetato)zirconium, mono-tert-butoxy.tris(ethylacetoacetato)zirconium, tetrakis(ethylacetoacetato)zirconium, mono(acetylacetonate)tris(ethylacetoacetato)zirconium, bis(acetylacetonate)bis(ethylacetoacetato)zirconium, and tris(acetylacetonate)mono(ethylacetoacetato) zirconium; aluminum chelate compounds such as tris(acetylacetonate)aluminum and tris(ethylacetoacetato)aluminum; and the like.

As examples of an organic acid, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid can be given.

As examples of an inorganic acid, hydrochloric acid, nitric acid, sulfuric acid, hydrofluoric acid, phosphoric acid, and the like can be given.

As examples of the organic salts, pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononane, diazabicycloundecene, and tetramethylammonium hydroxide can be given.

As examples of an inorganic base, ammonia, sodium hydroxide, potassium hydroxide, barium hydroxide, calcium hydroxide, and the like can be given.

Among these catalysts, base catalysts of organic bases and inorganic bases are preferable.

These catalysts may be used either individually or in a combination of two or more.

The catalyst is preferably used in an amount of 0.001 to 10 parts by mass, and more preferably 0.01 to 10 parts by mass, based on 100 parts by mass of all raw materials.

After the hydrolysis-condensation reaction, it is preferable to remove reaction by-products such as a lower alcohol (e.g. methanol and ethanol). Removing the reaction by-products increases the purity of an organic solvent and makes it possible to produce a composition having outstanding application properties and good storage stability.

Any method which does not cause the reaction of the hydrolyzate or condensate to proceed can be used for removing the reaction by-products without particular limitation. For example, the reaction by-products can be removed by evaporation under reduced pressure when the boiling point of the reaction by-products is lower than the boiling point of the organic solvent.

The silicon-containing film-forming composition of the embodiment of the present invention may contain only one type of polysiloxane (A) or may contain two or more types of polysiloxane (A).

(2) Solvent (B)

Examples of the solvent (B) used for the silicon-containing film-forming composition include aliphatic hydrocarbon solvents such as n-pentane, iso-pentane, n-hexane, iso-hexane, n-heptane, iso-heptane, 2,2,4-trimethylpentane, n-octane, iso-octane, cyclohexane, and methylcyclohexane; aromatic hydrocarbons solvents such as benzene, toluene, xylene, ethylbenzene, trimethylbenzene, methylethylbenzene, n-propylbenzene, iso-propylbenzene, diethylbenzene, iso-butylbenzene, triethylbenzene, di-isopropylbenzene, n-amylnaphthalene, and trimethylbenzene; monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; polyhydric alcohols such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerol;

ketone solvents such as acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, di-isobutyl ketone, trimethyl nonanone, cyclohexanone, methyl cyclohexanone, 2,4-pentane dione, acetonyl acetone, diacetone alcohol, acetophenone, and fenchone; ether solvents such as ethyl ether, iso-propyl ether, n-butyl ether, n-hexyl ether, 2-ethylhexyl ether, ethylene oxide, 1,2-propylene oxide, dioxolane, 4-methyldioxolane, dioxane, dimethyl dioxane, 2-methoxy ethanol, 2-ethoxyethanol, ethylene glycol diethyl ether, 2-n-butoxy ethanol, 2-n-hexoxy ethanol, 2-phenoxy ethanol, 2-(2-ethylbutoxy)ethanol, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, 1-n-butoxy-2-propanol, 1-phenoxy-2-propanol, propylene glycol monomethyl ether, propylene glycol monoethyl ether, propylene glycol monopropyl ether, dipropylene glycol monomethyl ether, dipropylene glycol monoethyl ether, dipropylene glycol monopropyl ether, tripropylene glycol monomethyl ether, tetrahydrofuran, and 2-methyltetrahydrofuran;

ester solvents such as diethyl carbonate, methyl acetate, ethyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropioneamide, and N-methylpyrrolidone; sulfur-containing type solvents such as dimethyl sulfide, diethyl sulfide, thiophene, tetrahydrothiophene, dimethylsulfoxide, sulfolane, and 1,3-propanesultone; and the like.

Among these solvents (B), ether solvents and ester solvents are preferable. Glycol solvents are particularly preferable due to excellent film forming capability. Specifically, propylene glycol monomethyl ether, propylene glycol monoethyl ether, propylene glycol monopropyl ether, acetic acid propylene glycol monomethyl ether, acetic acid propylene glycol monoethyl ether, and acetic acid propylene glycol monopropyl ether are preferable.

These solvents (B) may be used either individually or in combination.

(3) Other Components (i)

(3-1) Acid Generating Compound

In addition to the polysiloxane and the solvent, the silicon-containing film-forming composition of the embodiment of the present invention may include an acid-generating compound (hereinafter simply referred to as "acid generator") which generates an acid upon exposure to ultraviolet rays or by heating.

If the composition contains such an acid generator, an acid is generated in the silicon-containing film by exposing the resist to light or by heating after exposure, and supplied to the interface of the silicon-containing film and the resist film. As a result, a resist pattern having excellent resolution and reproducibility can be formed in an alkali development treatment of the resist film.

As an acid generator, a compound generating an acid by heat treatment (hereinafter referred to from time to time as "latent thermal acid generator") and a compound generating an acid by application of ultraviolet rays "hereinafter referred to from time to time as "latent photoacid generator") can be given.

The latent thermal acid generator is a compound that generates an acid when heated usually at 50 to 450° C., and preferably 200 to 350° C.

As examples of the latent thermal acid generator, an onium salt such as a sulfonium salt, a benzothiazolium salt, an ammonium salt, and a phosphonium salt can be given.

As specific examples of sulfonium salts, alkylsulfonium salts such as 4-acetophenyldimethylsulfonium hexafluoroantimonate, 4-acetoxyphenyldimethylsulfonium hexafluoroarsenate, dimethyl-4-(benzyloxycarbonyloxy)phenylsulfonium hexafluoroantimonate, dimethyl-4-(benzoyloxy) phenylsulfonium hexafluoroantimonate, dimethyl-4-(benzoyloxy)phenylsulfonium hexafluoroarsenate, and dimethyl-3-chloro-4-acetoxyphenylsulfonium hexafluoroantimonate; benzylsulfonium salts such as benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methoxyphenylmethylsulfonium hexafluoroantimonate, benzyl-2-methyl-4-hydroxyphenylmethylsulfonium hexafluoroantimonate, benzyl-3-chloro-4-hydroxyphenylmethylsulfonium hexafluoroarsenate, 4-methoxybenzyl-4-hydroxyphenylmethylsulfonium hexafluorophosphate, benzointosylate, and 2-nitrobenzyltosylate; dibenzylsulfonium salts such as dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-tert-butylphenylsulfonium hexafluoroantimonate, and benzyl-4-methoxybenzyl-4-hydroxyphenylsulfonium hexafluorophosphate; substituted benzylsulfonium salts such as p-chlorobenzyl-4-hydroxyphenylmethylsulfonium hexafluoroantimonate, p-nitrobenzyl-4-hydroxyphenylmethylsulfonium hexafluoroantimonate, p-chlorobenzyl-4-hydroxyphenylmethylsulfonium hexafluorophosphate, p-nitrobenzyl-3-methyl-4-hydroxyphenylmethylsulfonium hexafluoroantimonate, 3,5-dichlorobenzyl-4-hydroxyphenylmethylsulfonium hexafluoroantimonate, and o-chlorobenzyl-3-chloro-4-hydroxyphenylmethylsulfonium hexafluoroantimonate; and the like can be given.

As specific examples of a benzothiazonium salt, benzyl-benzothiazolium salts such as 3-benzylbenzothiazolium hexafluoroantimonate, 3-benzylbenzothiazolium hexafluorophosphate, 3-benzylbenzothiazolium tetrafluoroborate, 3-(p-methoxybenzyl)benzothiazolium hexafluoroantimonate, 3-benzyl-2-methylthiobenzothiazolium hexafluoroantimonate, and 3-benzyl-5-chlorobenzothiazolium hexafluoroantimonate can be given.

As an example of a thermal acid generator other than those mentioned above, 2,4,4,6-tetrabromocyclohexadienone can be given.

Among the above compounds, 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, 4-acetoxyphenylbenzylsulfonium hexafluoroantimonate, 3-benzylbenzothiazolium hexafluoroantimonate, and the like are preferably used. As examples of commercially available products of these compounds, Sunaide SI-L85, Sunaide SI-L110, Sunaide SI-L145, Sunaide SI-L150, and Sunaide SI-L160 (manufactured by Sanshin Kagaku Kogyo Co., Ltd.), and the like can be given.

The latent photoacid generator is a compound generating an acid by irradiation of ultraviolet rays at a dose of usually 1 to 100 mJ, and preferably 10 to 50 mJ.

Examples of photoacid generators include onium salt photoacid generators such as diphenyliodonium trifluoromethanesulfonate, diphenyliodonium pyrenesulfonate, diphenyliodonium dodecylbenzenesulfonate, diphenyliodonium nonafluoro-n-butanesulfonate, bis(4-tert-butylphenyl) iodonium trifluoromethanesulfonate, bis(4-tert-butylphenyl) iodonium dodecylbenzenesulfonate, bis(4-tert-butylphenyl) iodonium naphthalenesulfonate, bis(4-tert-butylphenyl) iodonium hexafluoroantimonate, bis(4-tert-butylphenyl) iodonium nonafluoro-n-butanesulfonate, triphenylsulfonium trifluoromethanesulfonate, triphenylsulfonium hexafluoroantimonate, triphenylsulfonium naphthalenesulfonate, triphenylsulfonium nonafluoro-n-butanesulfonate, (hydroxyphenyl)benzenemethylsulfonium toluenesulfonate, cyclohexylmethyl(2-oxocyclohexyl)sulfonium trifluoromethanesulfonate, dicyclohexyl(2-oxocyclohexyl)sulfonium trifluoromethanesulfonate, dimethyl(2-oxocyclohexyl) sulfonium trifluoromethanesulfonate, diphenyliodonium hexafluoroantimonate, triphenylsulfonium camphorsulfonate, (4-hydroxyphenyl)benzylmethylsulfonium toluenesulfonate, 1-naphtyldimethylsulfonium trifluoromethanesulfonate, 1-naphtyldiethylsulfonium trifluoromethanesulfonate, 4-cyano-1-naphtyldimethylsulfonium trifluoromethanesulfonate, 4-nitro-1-naphtyldimethylsulfonium trifluoromethanesulfonate, 4-methyl-1-naphtyldimethylsulfonium trifluoromethanesulfonate, 4-cyano-1-naphtyldiethylsulfonium trifluoromethanesulfonate, 4-nitro-1-naphtyldiethylsulfonium trifluoromethanesulfonate, 4-methyl-1-naphtyldiethylsulfonium trifluoromethanesulfonate, 4-hydroxy-1-naphtyldimethylsulfonium trifluoromethanesulfonate, 4-hydroxy-1-naphtyltetrahydrothiophenium trifluoromethanesulfonate, 4-methoxy-1-naphtyltetrahydrothiophenium trifluoromethanesulfonate, 4-ethoxy-1-naphtyltetrahydrothiophenium trifluoromethanesulfonate, 4-methoxymethoxy-1-naphtyltetrahydrothiophenium trifluoromethanesulfonate, 4-ethoxymethoxy-1-naphtyltetrahydrothiophenium trifluoromethanesulfonate, 4-(1-methoxyethoxy)-1-naphtyltetrahydrothiophenium trifluoromethanesulfonate, 4-(2-methoxyethoxy)-1-naphtyltetrahydrothiophenium trifluoromethanesulfonate, 4-methoxycarbonyloxy-1-naphtyltetrahydrothiophenium trifluoromethanesulfonate, 4-ethoxycarbonyloxy-1-naphtyltetrahydrothiophenium trifluoromethanesulfonate, 4-n-propoxycarbonyloxy-1-naphtyltetrahydrothiophenium trifluoromethanesulfonate, 4-isopropoxycarbonyloxy-1-naphtyltetrahydrothiophenium trifluoromethanesulfonate, 4-n-butoxycarbonyloxy-1-naphtyltetrahydrothiophenium trifluoromethanesulfonate, 4-tert-butoxycarbonyloxy-1-naphtyltetrahydrothiophenium trifluoromethanesulfonate, 4-(2-tetrahydrofuranyloxy)-1-naphtyltetrahydrothiophenium trifluoromethanesulfonate, 4-(2-tetrahydropyranyloxy)-1-naphtyltetrahydrothiophenium trifluoromethanesulfonate, 4-benzyloxy-1-naphtyltetrahydrothiophenium trifluoromethanesulfonate, and 1-(naphtylacetomethyl)tetrahydrothiophenium trifluoromethanesulfonate; halogen-containing compound photoacid generators such as phenyl-bis(trichloromethyl)-s-triazine, methoxyphenyl-bis(trichloromethyl)-s-triazine, and naphtyl-bis(trichloromethyl)-s-triazine; diazoketone photoacid generators such as 1,2-naphthoquinone diazide-4-sulfonylchloride, 1,2-naphthoquinone diazide-5-sulfonylchloride, 1,2-naphthoquinone diazide-4-sulfonate or 1,2-naphthoquinone diazide-5-sulfonate of 2,3,4,4'-tetrabenzophenone; and sulfonic acid compound photoacid generators such as 4-trisphenacylsulfone, mesitylphenacylsulfone, bis(phenylsulfonyl)methane; benzointosylate, pyrogallol tris(trifluoromethanesulfonate), nitrobenzyl-9,10-diethoxyanthracene-2-sulfonate, trifluoromethanesulfonylbicyclo[2,2,1]hept-5-ene-2,3-dicarbodiimide, N-hydroxysuccinimido trifluoromethanesulfonate, and 1,8-naphthalenedicarboxylic acid imide trifluoromethanesulfonate.

These acid generators may be used either individually or in a combination of two or more.

The amount of the acid generator is preferably 0.1 to 10 parts by mass, and more preferably 0.1 to 5 parts by mass for 100 parts by mass of the solid components of the polysiloxane (A).

(3-2) β-Diketone

The silicon-containing film-forming composition of the embodiment of the present invention may further contain a β-diketone which increases the uniformity of a coating film formed therefrom and the storage stability.

As examples of the β-diketone, acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione can be given. These β-diketones may be used either individually or in combination.

The content of the β-diketone is preferably 1 to 50 parts by mass, and more preferably 3 to 30 parts by mass, based on 100 parts by mass of the total of the 3-diketone and the solvent (B).

(4) Other Components (ii)

The silicon-containing film-forming composition of the embodiment of the present invention may further include components such as colloidal silica, colloidal alumina, an organic polymer, a surfactant, and the like.

Colloidal silica is a dispersion of high purity silicic anhydride in a hydrophilic organic solvent with a solid content, for example, of about 10 to 40 mass %, wherein silica particles with an average diameter of 5 to 30 nm, and preferably 10 to 20 nm, are dispersed. Such colloidal silica is commercially available, for example, as methanol silica sol or iso-propanol silica sol (manufactured by Nissan Chemical Industries, Ltd.) or Oscal (manufactured by Catalysts & Chemicals Ind. Co., Ltd.). These colloidal silicas may be used either individually or in combination.

The above colloidal alumina is commercially available, for example, as Alumina Sol 520, Alumina Sol 100, or Alumina Sol 200 (manufactured by Nissan Chemical Industries, Ltd.), and Alumina Clear Sol, Alumina Sol 10, or Alumina Sol 132 (manufactured by Kawaken Fine Chemicals Co., Ltd.). These colloidal aluminas may be used either individually or in combination.

As examples of the organic polymer, a compound having a polyalkylene oxide structure, a compound having a sugar chain structure, a vinylamide polymer, an acrylate compound, an aromatic vinyl compound, a dendrimer, a polyimide, a polyamic acid, a polyarylene, a polyamide, a polyquinoxaline, a polyoxadiazole, and a fluorine-containing polymer can be given. These organic polymers may be used either individually, or in a combination of two or more.

As examples of the surfactant, nonionic surfactants, anionic surfactants, cationic surfactants, amphoteric surfactants, silicon-containing surfactants, polyalkylene oxide surfactants, and fluorine-containing surfactants can be given. These surfactants may be used either individually or in combination.

[2] Method of Producing Silicon-Containing Film-Forming Composition

The silicon-containing film-forming composition of the embodiment of the present invention can be obtained by, for example, mixing the polysiloxane (A), the solvent (B), and the optionally used other additives.

Although there are no specific limitations, the solid content of resins in the silicon-containing film-forming composition is preferably 1 to 20 mass %, and more preferably 1 to 15 mass %.

[1] Silicon-Containing Film

The silicon-containing film of the embodiment of the present invention has exhibits excellent adhesion with a resist film and other resist underlayer films and can form a resist pattern having an excellent bottom shape with no skirt-like extension. Therefore, the silicon-containing film can be preferably used in a multilayer resist process. Among multilayer resist processes, the silicon-containing film is particularly suitable for forming a pattern in a fine region of less than 90 nm (ArF nanoimprint technology and liquid immersion lithography nanoimprint using ArF, $F_2$, or EUV).

The silicon-containing film can be obtained using the above-described silicon-containing film-forming composition. The silicon-containing film (resist underlayer film) can be prepared by forming a coating of the silicon-containing film-forming composition on the surface of a resist film or other underlayer film (antireflection film) and heating the film after coating or after irradiation with ultraviolet rays when the composition contains a latent photoacid generator, thereby curing the film.

As the method for applying the silicon-containing film-forming composition, a spin coating method, a roll coating method, a dip coating method, and the like may be used.

The temperature for heating the coating formed is usually 50 to 450° C., and the thickness of the resulting film is usually from 10 to 200 nm

[4] Pattern Forming Method

The pattern forming method of the embodiment of the present invention includes (1) applying the silicon-containing film-forming composition to a substrate to form a silicon-containing film (hereinafter referred to simply as "step (1)"), (2) applying a resist composition to the silicon-containing film to form a resist film (hereinafter referred to simply as "step (2)"), (3) selectively exposing the resist film to radiation through a photomask (hereinafter referred to simply as "step (3)"), (4) developing the exposed resist film to form a resist pattern (hereinafter referred to simply as "step (4)"), and (5) dry-etching the silicon-containing film and the substrate using the resist pattern as a mask (etching mask) to form a pattern (hereinafter referred to simply as "step (5)").

According to the pattern forming method of the embodiment of the present invention, a resist pattern can be faithfully transferred to a substrate with good reproducibility in a dry-etching process.

(4-1) Step (1)

In step (1), a silicon-containing film is formed on a substrate to be processed using the above-described silicon-containing film-forming composition. A substrate with a silicon-containing film formed thereon can be obtained in this manner.

As examples of the substrate, insulation films of silicon oxide, silicon nitride, silicon oxynitride, or polysiloxane, and interlayer dielectric films such as a wafer covered with a low dielectric insulation film such as "Black Diamond" (manufactured by AMAT), "SiLK" (manufactured by Dow Chemical Co.), and "LKD5109" (manufactured by JSR Corp.) can be given. As the substrate, a substrate having a pattern of a trench, a plug groove (via), and the like may be used.

The substrate may have a previously formed resist underlayer film (a resist underlayer film different from the silicon-containing film formed from the composition of the embodiment of the present invention).

This resist underlayer film reinforces functions possessed by the silicon-containing film and/or the resist underlayer film or is provided with other functions such as a reflection preventing function, coated film flattening properties, and high etching resistance to fluorine-containing gas such as $CF_4$ in the resist pattern formation.

The above resist underlayer film can be formed using materials commercially available under the trade names such as "NFC HM8005" (manufactured by JSR Corp.) and "NFC CT08" (manufactured by JSR Corp.).

Although not particularly limited, the above resist underlayer film can be formed by applying materials for the above-mentioned resist underlayer film forming composition to the substrate by a known method such as spin coating and curing the film by exposing the film to light or heating it.

As radiation used for curing the film, visible rays, ultraviolet rays, deep ultraviolet rays, X-rays, electron beams, γ-rays, molecular rays, ionized beams, and the like can be given.

The temperature for heating the film is not particularly limited. A temperature of 90 to 550° C. is preferable, with a more preferable temperature being 90 to 450° C., and particularly preferable temperature being 90 to 300° C.

Although not specifically limited, the thickness of the above resist underlayer film is preferably 100 to 20,000 nm.

The above discussion about the silicon-containing film forming method and the film thickness in section [3] pertaining to the silicon-containing film can be applied as it is to the silicon-containing film forming method and film thickness of this step (1).

(4-2) Step (2)

In step (2), a resist film is formed on the silicon-containing film obtained in step (1) using a resist composition.

As preferred examples of the resist composition used in step (2), a positive-tone or a negative-tone chemically amplified resist composition containing a photoacid generator, a positive-tone resist composition including an alkali-soluble resin and a quinon diazide sensitizer, and a negative-tone resist composition including an alkali-soluble resin and a crosslinking agent can be given.

Although there are no particular limitations to the solid content of the resist composition, a concentration of between 5 and 50 mass % is preferable.

A resist composition filtered through a membrane filter with a pore size of about 0.2 μm is preferably used. A commercially available resist composition may be used as it is in the pattern forming method of the embodiment of the present invention.

There are no particular limitations to the method of applying the resist composition. A general method such as a spin-coating method can be used. The amount of the resist composition used is adjusted so that a resist film having a specified thickness can be obtained.

The resist film can be formed by volatilizing the solvent from the coating (solvent contained in the resist composition) that has been produced by applying the resist composition by prebaking the coating.

The prebaking temperature is appropriately adjusted according to the type of resist composition in a range preferably from 30 to 200° C., and more preferably from 50 to 150° C.

(4-3) Step (3)

In the step (3), a resist film obtained in step (2) is selectively exposed to radiation through a photomask.

Radiation used for exposure in step (3) is appropriately selected according to the type of photoacid generator used in the resist composition from among visible rays, ultraviolet rays, deep ultraviolet rays, X-rays, electron beams, γ-rays, molecular beams, ion beams, and the like. Of these types of radiation, deep ultraviolet rays, particularly those produced by a KrF excimer laser (wavelength: 248 nm), an ArF excimer laser (wavelength: 193 nm), an $F_2$ excimer laser (wavelength: 157 nm), a $Kr_2$ excimer laser (wavelength: 147 nm), or an ArKr excimer laser (wavelength: 134 nm), and extreme ultraviolet rays (wavelength: 13 nm) are preferable.

There are also no particular limitations to the method of exposure. A method used in a general pattern forming method may be employed.

(4-4) Step (4)

In the step (4), a resist pattern is formed by developing the resist film exposed to radiation in step (3).

The developer used in this step is appropriately selected according to the type of resist composition. Examples of the developer for the positive-tone chemically amplified resist composition and the positive-tone resist composition containing an alkali-soluble resin include alkaline aqueous solutions such as sodium hydroxide, potassium hydroxide, sodium carbonate, sodium silicate, sodium meta-silicate, ammonia, ethylamine, n-propylamine, diethylamine, di-n-propylamine, triethylamine, methyldiethylamine, dimethyl ethanolamine, triethanolamine, tetramethyl ammonium hydroxide, tetraethyl ammonium hydroxide, pyrrole, piperidine, choline, 1,8-diazabicyclo[5.4.0]-7-undecene, and 1,5-diazabicyclo[4.3.0]-5-nonene. An appropriate amount of an aqueous organic solvent, alcohol such as methanol and ethanol, and a surfactant can be optionally added to the alkaline aqueous solution.

Examples of the developer for the negative-tone chemically amplified resist composition and the negative-tone resist composition containing an alkali-soluble resin include aqueous solutions containing an alkali, for example, inorganic alkali compounds such as sodium hydroxide, potassium hydroxide, sodium carbonate, sodium silicate, sodium meta-silicate, and ammonia, primary amines such as ethylamine and n-propylamine, secondary amines such as diethylamine and di-n-butylamine, tertiary amines such as triethylamine and methyldiethylamine, alcohol amines such as dimethyl ethanolamine and triethanolamine, quaternary ammonium salts such as tetramethyl ammonium hydroxide, tetraethyl ammonium hydroxide, and choline, and cyclic amines such as pyrrole and piperidine.

In the step (4), the developed resist film is washed and dried to form the target resist pattern conforming to the pattern of the photomask.

In this step (4), it is preferable to postbake the resist film before development (i.e. after exposure to radiation in step (3)) in order to improve resolution, pattern profile, developability, and the like. The temperature of postbaking is appropriately adjusted according to the type and the like of the resist composition used in a range preferably of 50 to 200° C., and more preferably 80 to 150° C.

(4-5) Step (5)

In the step (5), the silicon-containing film and the substrate are dry-etched using the resist pattern formed in step (4) as a mask (dry etching mask). When a substrate on which a resist underlayer film has been formed is used, the resist underlayer film is dry-etched together with the silicon-containing film and the substrate.

The dry-etching is carried out using a general dry-etching device.

As a source gas used in the dry-etching, oxygen gas, an oxygen-containing gas such as CO and $CO_2$, an inert gas such as He, $N_2$, and Ar, chlorine gas, a chlorine-containing gas such as $BCl_4$, as well as $H_2$, $NH_3$, and the like can be used. A mixture of these gases may also be used.

According to the pattern forming method of the embodiment of the present invention, a desired pattern for processing a substrate can be formed by appropriately performing steps (1) to (5).

EXAMPLES

The present invention is further described below by way of examples. Note that the present invention is not limited to the following examples. In the examples, "parts" and "%" respectively refer to "parts by mass" and "mass %", unless otherwise indicated.

[1] Synthesis Polymer (Polysiloxane (A))

In the later-described Synthesis Examples, the following monomers (M-1) to (M-5) were used to synthesize polymers.

M-1: tetramethoxysilane [compound to provide the above structural unit (a1)]

M-2: 4-methylphenyltrimethoxysilane [compound to provide the above structural unit (a2)]

M-3: 4-methylbenzyltrimethoxysilane [compound to provide the above structural unit (a2)]

M-4: methyltrimethoxysilane [compound to provide the above structural unit (a3)]

M-5: phenyltrimethoxysilane [compound to provide the above structural unit (a5)]

Si(OCH₃)₄ (M-1)

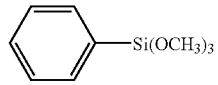
(M-2)

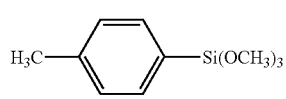
(M-3)

H₃C—Si(OCH₃)₃ (M-4)

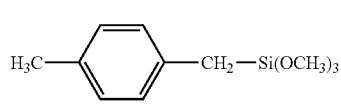
(M-5)

Synthesis Example 1

Polysiloxane (A-1)

50 parts of tetramethylammonium hydroxides was dissolved in 150 parts of water while heating to prepare an aqueous solution of tetraammonium hydroxide. A flask charged with 137 parts of the tetraammonium hydroxide aqueous solution, 43 parts of water, and 375 parts of methanol was fitted with a condenser and a dropping funnel containing 100 parts of tetramethoxysilane (compound shown by the above formula (M-1)), 10 parts of 4-methylphenyltrimethoxysilane (compound shown by the above formula (M-4)), 32 parts of methyltrimethoxysilane (compound shown by the above formula (M-3)), and 142 parts of methanol. After heating to 60° C. on an oil bath, the solution was slowly added dropwise and the mixture was reacted at 60° C. for two hours. After the reaction, the flask containing the reaction solution was allowed to cool.

The resulting cooled reaction solution was added dropwise to 400 parts of a maleic acid methanol solution separately prepared by dissolving 5 parts of maleic anhydride in 495 parts of water and 393 parts of methanol, followed by stirring for 30 minutes. Then, after adding 470 parts of 4-methyl-2-pentenone, the flask was fitted with an evaporator to remove the reaction solvent and methanol which was produced by the reaction, thereby obtaining a 4-methyl-2-pentenone resin solution. The resulting resin solution was transferred to a separating funnel and washed with 750 parts of water, and then 375 parts of water. Then, after adding 370 parts of propylene glycol monoethyl ether the resin solution of 4-methyl-2-pentenone which had been transferred to a flask from the separating funnel, the flask was fitted with an evaporator to remove 4-methyl-2-pentenone to obtain a resin solution. The solid component (polysiloxane) in the resin solution is referred to as polymer (A-1).

The proportion of the solid component in the resin solution was measured by a curing method to find that the concentration was 16.3%. The weight average molecular weight (Mw) of the solid component was 3500.

In this Example, the weight average molecular weight (Mw) was measured by the following method.

<Measurement of Weight Average Molecular Weight (Mw)>

Mw and Mn were measured by gel permeation column chromatography (GPC) using monodisperse polystyrene as a standard and using GPC columns (manufactured by Tosoh Corp., G2000HXL×2, G3000HXL×1, G4000HXL×1) at a flow rate of 1.0 ml/minute, using tetrahydrofuran as an eluente, at a column temperature of 40° C.

Synthesis Example 2

Polysiloxane (A-2)

A polymer (A-2) was prepared in the same manner as in Synthesis Example 1, except for using monomers shown in Table 1 in amounts shown in Table 1.

Synthesis Example 3

Polysiloxane (A-3)

An oxalic acid aqueous solution was prepared by dissolving 4 parts of oxalic acid in 100 parts of water while heating. A flask charged with 100 parts of tetramethoxysilane (compound shown by the above formula (M-1)), 10 parts of 4-methylphenyltrimethoxysilane (compound shown by the above formula (M-2)), 32 parts of methyltrimethoxysilane (compound shown by the above formula (M-4)), and 500 parts of propylene glycol monoethyl ether was fitted with a condenser and a dropping funnel containing the above oxalic acid aqueous solution. After heating to 60° C. on an oil bath, the oxalic acid aqueous solution was slowly added dropwise and the mixture was reacted at 60° C. for four hours.

After the reaction, the flask containing the reaction solution was allowed to cool and fitted with an evaporator to remove methanol produced during the reaction, thereby obtaining a resin solution. The solid component (polysiloxane) in the resin solution is referred to as polymer (A-3).

Synthesis Example 4

Polysiloxane (A-4)

A polymer (A-4) was prepared in the same manner as in Synthesis Example 3, except for using monomers shown in Table 1 in amounts shown in Table 1, and using 50 parts of water.

Synthesis Example 5

Polysiloxane (AR-1)

A polymer (AR-1) was prepared in the same manner as in Synthesis Example 1, except for using monomers shown in Table 1 in amounts shown in Table 1.

The amount of monomers used for preparing the resin solutions, the solid content, the solid content, and the weight-average molecular weight (Mw) of the solid component of the resin solutions obtained in Synthesis Examples 2 to 5 were measured in the same manner as in Synthesis Example 1. The results are shown in Table 1. Table 1 also shows the resin compositions (theoretical value, units: mol %) determined from the amount of monomers used.

[2] Preparation of Silicon-Containing Film-Forming Composition

Silicon-containing film-forming compositions of Examples 1 to 3 and Comparative Example 1 were prepared using the polysiloxanes (A) (Polysiloxanes (A-1) to (A-3) and (AR-1)) obtained in the above Synthesis Examples and the solvents (B) (solvents (B1) and (B-2)) as follows.

Example 1

A silicon-containing film-forming composition of Example 1 was prepared by dissolving 14 parts of polysiloxane (A-1) prepared in Synthesis Example 1 in 73 parts of solvent (B-1) and 13 parts of solvent (B-2) as shown in Table 2, and filtering the resulting solution through a filter with a pore size of 0.2 μm.

Details of solvents (B) shown in Table 2 are as follows.
B-1: propylene glycol monopropyl ether
B-2: propylene glycol monoethyl ether
B-3: acetic acid propylene glycol monomethyl ether

Examples 2 to 5 and Comparative Example 1

Silicon-containing film-forming compositions of Examples 2 to 5 and Comparative Example 1 were prepared in the same manner as in Example 1 except for using the components shown in Table 2 in proportions shown in Table 2.

TABLE 2

|  | Polysiloxane Type (parts) | Solvent Type (parts) | |
| --- | --- | --- | --- |
| Example 1 | A-1 (14) | B-1 (73) | B-2 (13) |
| Example 2 | A-2 (14) | B-1 (73) | B-2 (13) |
| Example 3 | A-3 (12) | B-1 (73) | B-2 (15) |
| Example 4 | A-4 (11) | B-3 (75) | B-2 (14) |
| Example 5 | A-1 (5), A-4 (6) | B-3 (75) | B-1 (14) |
| Comparative Example 1 | AR-1 (13) | B-1 (73) | B-2 (14) |

[3] Evaluation of Silicon-Containing Film-Forming Compositions (Examples 1 to 5 and Comparative Example 1)

The following evaluations were carried out using the compositions of Examples 1 to 5 and Comparative Example 1 obtained above. The results are shown in Table 3.

(1) Storage Stability of Solution

The silicon-containing film-forming composition was applied to a surface of a silicon wafer by running a spin coater

TABLE 1

|  | Polysiloxane | Monomers | Amount of monomers (parts) | Resin composition (mol %) | Mw | Solid content (mass %) |
| --- | --- | --- | --- | --- | --- | --- |
| Synthesis Example 1 | A-1 | M-1 | 100 | 70 | 3500 | 14.7 |
|  |  | M-2 | 10 | 5 |  |  |
|  |  | M-4 | 32 | 25 |  |  |
| Synthesis Example 2 | A-2 | M-1 | 100 | 70 | 4000 | 14.6 |
|  |  | M-3 | 11 | 5 |  |  |
|  |  | M-4 | 32 | 25 |  |  |
| Synthesis Example 3 | A-3 | M-1 | 100 | 70 | 1600 | 16.3 |
|  |  | M-2 | 10 | 5 |  |  |
|  |  | M-4 | 32 | 25 |  |  |
| Synthesis Example 4 | A-4 | M-1 | 100 | 85 | 1300 | 15.0 |
|  |  | M-2 | 3.3 | 2 |  |  |
|  |  | M-4 | 10 | 9 |  |  |
|  |  | M-5 | 6.1 | 4 |  |  |
| Synthesis Example 5 | AR-1 | M-1 | 100 | 70 | 4200 | 15.8 |
|  |  | M-4 | 32 | 25 |  |  |
|  |  | M-5 | 9 | 5 |  |  | at 2000 rpm for 20 seconds. The coated film was dried on a hot plate at 250° C. for 60 seconds to form a silicon-containing film. The thickness of the silicon-containing film obtained was measured at 50 points using an optical film thickness meter ("UV-1280SE" manufactured by KLA-Tencor), and an average thickness (initial thickness=$T_O$) was determined.

A silicon-containing film was prepared in the same manner as above using a composition after storing for three months at 23° C., and an average thickness (thickness after storing=T) was determined in the same manner as above.

The difference (T−$T_O$) of the initial film thickness ($T_O$) and the thickness after storing (T), was determined and the ratio, (T−$T_O$)/$T_O$, was calculated as the rate of film thickness change. The storage stability was evaluated as "Good" when the rate was 5% or less, and as "Bad" when the rate was more than 5%.

(2) Adhesion

An underlayer film forming composition ("NFC HM8005" manufactured by JSR Corp.) was applied to the surface of a silicon wafer using a spin coater and dried on a hot plate at 250° C. for 60 seconds to form an underlayer film with a thickness of 300 nm.

The silicon-containing film-forming composition was applied to a surface of the underlayer film using a spin coater. The coated film was dried on a hot plate at 250° C. for 60 seconds to form a silicon-containing film.

Next, a resist material ("AIM5056JN" manufactured by JSR Corp.) was applied to the silicon-containing film and dried at 90° C. for 60 seconds. In this instance, the resist film thickness was controlled to 120 nm. The surface of the substrate was irradiated with an ArF excimer laser at a dose of 32 mJ/cm$^2$ using an ArF excimer laser exposure device ("S306C" manufactured by NIKON Corp.). The substrate was then dried with heating at 115° C. for 60 seconds and developed in a 2.38% aqueous solution of tetramethylammonium hydroxide for 30 seconds to form an 80 nm line-and-space resist pattern.

The resist pattern formed on the substrate in this manner was inspected by a scanning electron microscope (SEM). The sample was evaluated as "Good" when there was no development delamination in the resist pattern, and as "Bad" when there was development delamination.

(3) Reproducibility of Resist Pattern

A resist pattern formed in the same manner as in (2) above was inspected by SEM. The sample was evaluated as "Good" when there was no resist film residue in the area irradiated with the laser beam and there was no skirt-like extension in an 80 nm line-and-space pattern of the exposure mask, and as "Bad" when there was a skirt-like extension.

TABLE 3

| | Storage stability of solution (film thickness increase/%) | Adhesiveness of resist | Bottom shape of resist pattern |
|---|---|---|---|
| Example 1 | Good (2.0) | Good | Good |
| Example 2 | Good (1.8) | Good | Good |
| Example 3 | Good (3.6) | Good | Good |
| Example 4 | Good (0.5) | Good | Good |
| Example 5 | Good (1.5) | Good | Good |
| Comparative Example 1 | Good (2.1) | Bad | Bad |

As is clear from Table 3, the silicon-containing film-forming compositions of Examples 1 to 5 and Comparative Example 1 were found to have excellent storage stability. It was found that silicon-containing films exhibiting excellent adhesion to resist film can be formed and resist patterns with an excellent bottom shape without skirt-like extension can be formed using these compositions.

The silicon-containing film-forming composition, the silicon-containing film, and the pattern forming method of the embodiment of the present invention can be suitably used in a multilayer resist process. Among multilayer resist processes, the composition is particularly suitable for forming a pattern using a multilayer resist process in a fine region of less than 90 nm (ArF nanoimprint technology and liquid immersion lithography nanoimprint using ArF, $F_2$, or EUV).

The silicon-containing film-forming composition of the embodiment of the present invention has excellent storage stability, has a large Si content, and can form a silicon-containing film exhibiting excellent adhesion with a resist film. In addition, the composition can stably form a resist pattern with no skirt-like extension. Therefore, among multilayer resist processes, the composition is particularly suitable for forming a pattern using a multilayer resist process in a fine region of less than 90 nm (ArF nanoimprint technology and liquid immersion lithography nanoimprint using ArF, $F_2$, or EUV).

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A silicon-containing film-forming composition comprising:
   a polysiloxane comprising:
      a first structural unit derived from a tetraalkoxysilane;
      a second structural unit derived from a compound shown by formula (1a); and
      a third structural unit derived from a compound shown by formula (2); and
   an organic solvent,
   wherein an amount of the second structural unit in the polysiloxane is from 1 to 20 parts by mol with respect to 100 parts by mol of the first structural unit, and an amount of the third structural unit in the polysiloxane is from 10 to 50 parts by mol with respect to 100 parts by mol of the first structural unit,

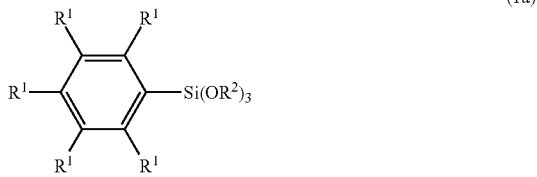

(1a)

wherein $R^1$ represents a hydrogen atom or an electron-donating group, at least one $R^1$ is an electron-donating group, and $R^2$ represents a monovalent organic group,

(2)

wherein $R^3$ represents an alkyl group having 1 to 8 carbon atoms, and $R^4$ represents a monovalent organic group.

2. The silicon-containing film-forming composition according to claim 1, wherein the electron-donating group in the formula (1a) comprises at least one of an alkyl group having 1 to 4 carbon atoms, a hydroxyl group, a methoxy group, a phenoxy group, an amino group, a dimethylamino group, and an acetylamino group.

3. The silicon-containing film-forming composition according to claim 2, wherein the polystyrene-reduced weight average molecular weight of the polysiloxane determined by gel permeation column chromatography is about 500 to about 15,000.

4. A pattern forming method comprising:
applying the silicon-containing film-forming composition according to claim 2 to a substrate to form a silicon-containing film;
applying a resist composition to the silicon-containing film to form a resist film;
exposing the resist film to radiation through a photomask;
developing the exposed resist film to form a resist pattern; and
dry-etching the silicon-containing film and the substrate using the resist pattern as a mask to form a pattern.

5. The silicon-containing film-forming composition according to claim 1, wherein the second structural unit is derived from a compound shown by formula (1-1),

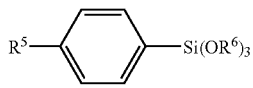

(1-1)

wherein $R^5$ represents an alkyl group having 1 to 4 carbon atoms, and $R^6$ represents a monovalent organic group.

6. A pattern forming method comprising:
applying the silicon-containing film-forming composition according to claim 5 to a substrate to form a silicon-containing film;
applying a resist composition to the silicon-containing film to form a resist film;
exposing the resist film to radiation through a photomask;
developing the exposed resist film to form a resist pattern; and
dry-etching the silicon-containing film and the substrate using the resist pattern as a mask to form a pattern.

7. The silicon-containing film-forming composition according to claim 1, wherein the polystyrene-reduced weight average molecular weight of the polysiloxane determined by gel permeation column chromatography is about 500 to about 15,000.

8. The silicon-containing film-forming composition according to claim 1, wherein the organic solvent comprises at least one of ether solvents and ester solvents.

9. The silicon-containing film-forming composition according to claim 1, wherein the silicon-containing film-forming composition comprises a structure to be used for a multilayer resist process.

10. A pattern forming method comprising:
applying the silicon-containing film-forming composition according to claim 1 to a substrate to form a silicon-containing film;
applying a resist composition to the silicon-containing film to form a resist film;
exposing the resist film to radiation through a photomask;
developing the exposed resist film to form a resist pattern; and
dry-etching the silicon-containing film and the substrate using the resist pattern as a mask to form a pattern.

11. A method of producing a silicon-containing film comprising:
coating the silicon-containing film-forming composition according to claim 1 on a surface of a substrate; and
heating the coated silicon-containing film-forming composition.

12. The silicon-containing film-forming composition according to claim 1, wherein the polysiloxane further comprises a fourth structural unit derived from a compound shown by formula (3),

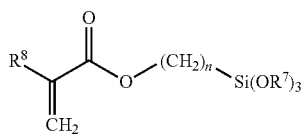

(3)

wherein $R^7$ represents a monovalent organic group, $R^8$ represents a linear or branched alkyl group having 1 to 4 carbon atoms, and n represents an integer of 1 to 4.

13. The silicon-containing film-forming composition according to claim 12, wherein an amount of the fourth structural unit in the polysiloxane is from 1 to 30 parts by mol with respect to 100 parts by mol of the first structural unit.

14. The silicon-containing film-forming composition according to claim 1, wherein an amount of the second structural unit in the polysiloxane is from 5 to 15 parts by mol with respect to 100 parts by mol of the first structural unit.

15. The silicon-containing film-forming composition according to claim 1, wherein an amount of the third structural unit in the polysiloxane is from 20 to 40 parts by mol with respect to 100 parts by mol of the first structural unit.

* * * * *